(12) United States Patent
Kaneko et al.

(10) Patent No.: US 6,395,453 B1
(45) Date of Patent: May 28, 2002

(54) PHOTORESIST COMPOSITIONS AND PATTERNING METHOD

(75) Inventors: Tatsushi Kaneko; Kenji Koizumi; Satoshi Watanabe; Yoshitaka Yanagi, all of Naka Kubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/514,295

(22) Filed: Feb. 28, 2000

(30) Foreign Application Priority Data

Mar. 4, 1999 (JP) ............................ 11-056944

(51) Int. Cl.⁷ .............................. G03F 7/027
(52) U.S. Cl. ................ 430/281.1; 430/270.1; 430/326
(58) Field of Search .............. 430/270.1, 281.1, 430/325, 326

(56) References Cited

U.S. PATENT DOCUMENTS

| | | | |
|---|---|---|---|
| 4,356,255 A | * 10/1982 | Tachikawa et al. | 430/325 |
| 5,627,010 A | * 5/1997 | Pai et al. | 430/270.1 |
| 5,968,712 A | * 10/1999 | Thackeray et al. | 430/326 |

FOREIGN PATENT DOCUMENTS

| | | |
|---|---|---|
| JP | A-6-266112 | 9/1994 |
| JP | A-9-211866 | 8/1997 |
| JP | A-9-291681 | 11/1997 |
| JP | A-9-297401 | 11/1997 |
| JP | 09297401 | * 11/1997 |

OTHER PUBLICATIONS

Translation of JP 09297401, Nov. 1997.*
JP 09297401, English abstract.*

* cited by examiner

*Primary Examiner*—Rosemary Ashton
(74) *Attorney, Agent, or Firm*—Oliff & Berridge, PLC

(57) ABSTRACT

There are disclosed a photoresist composition containing at least an α,β-unsaturated ketone compound, and a patterning method comprising a step of application of a photoresist composition containing at least an α,β-unsaturated ketone compound to a substrate, a step of, after a heat treatment, exposure with a high energy ray having a wavelength of 500 nm or less, X-ray or electron ray through a photomask, and a step of development with a developer. According to the present invention, there are provided a photoresist composition exhibiting excellent stability as for sensitivity against long term storage and environmental temperature variation, and a patterning method utilizing the photoresist composition.

7 Claims, No Drawings

PHOTORESIST COMPOSITIONS AND PATTERNING METHOD

BACKGROUND OF THE INVENTION

1. Field of the Invention

The present invention relates to a novel photoresist composition, which is suitable for fine processing techniques using photolithography, and a patterning method.

2. Related Art

While a finer pattern rule has recently been required with the use of LSI's of higher integration degree or higher processing speed, far ultraviolet ray lithography has been recognized as a promising fine processing technique of the next generation. This far ultraviolet ray lithography enables processing of lines having a width of 0.3 μm or less, and it can form a pattern having sides substantially perpendicular to a substrate, when a photoresist composition of low light absorption is used.

Further, techniques utilizing highly luminous KrF or ArF excimer lasers as a source of far ultraviolet ray are recently attracting much attention. In view of this, chemical amplification type photoresist compositions utilizing an acid as a catalyst have been developed. However, with the progress of techniques for large-scale production, more stable photoresist compositions with smaller fluctuation of sensitivity during the storage or use thereof have been required.

However, as a drawback of the chemical amplification type photoresist compositions, there has hitherto been recognized a problem that, when the standing time from the exposure to PEB (Post Exposure Bake) becomes longer, acid generated by the exposure on the surface of the photoresist film reacts with basic compounds in the air to be inactivated, and thus only upper parts of the formed line patterns become thick (referred to as "T-top shape" hereinafter).

In order to solve this problem, Japanese Patent Unexamined Publication No. 9-297401 proposed addition of an α,β-unsaturated carboxylic acid ester such as methacrylic esters and acrylic acid esters, or an α,β,α',β'-unsaturated ketones such as phorone. The addition of such an α,β-unsaturated carboxylic acid ester or α,β,α',β'-unsaturated ketone is in fact effective for the prevention of the T-top shape to some extent, but there has been a problem that it does not provide sufficient effect on the prevention of the sensitivity fluctuation of photoresist compositions.

SUMMARY OF THE INVENTION

The present invention has been accomplished in view of the aforementioned problems, and its object is to provide a photoresist composition showing excellent stability of sensitivity even after long term storage or exposure to environmental temperature variation, and a patterning method using it.

The present invention has been accomplished in order to achieve the aforementioned object, and provides a photoresist composition containing at least an α,β-unsaturated ketone compound.

The photoresist composition containing at least an α,β-unsaturated ketone compound is unlikely to be affected by long term storage or environmental temperature variation upon use. Therefore, it can be a photoresist composition of excellent stability of sensitivity.

In the aforementioned photoresist composition, the α,β-unsaturated ketone compound is preferably one represented by the following general formula (1).

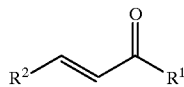

(1)

In the formula, $R^1$ and $R^2$ independently represent a linear alkyl group having 1–10 carbon atoms, a branched alkyl group or a cycloalkyl group having 3–10 carbon atoms, or an aryl group having 6–14 carbon atoms.

The photoresist composition containing at least an α,β-unsaturated ketone compound represented by the aforementioned general formula (1) is surely unlikely to be affected by long term storage or environmental temperature variation upon use. Therefore, it can be a photoresist composition of more excellent stability of sensitivity.

Further, the photoresist composition may be a chemical amplification type photoresist composition for which exposure is performed with a high energy ray having a wavelength of 500 nm or less, X-ray or electron ray.

The photoresist composition of the present invention is particularly advantageous when it is used as a chemical amplification type composition for which exposure is performed with a high energy ray having a wavelength of 500 nm or less, X-ray or electron ray.

The present invention also provides a patterning method comprising at least the following steps:

(i) a step of application of the aforementioned photoresist composition of the present invention to a substrate, (ii) a step of, after a heat treatment, exposure with a high energy ray having a wavelength of 500 nm or less, X-ray or electron ray through a photomask, and (iii) a step of development with a developer.

The patterning method comprising at least the above steps of (i) to (iii) can prevent variation of sensitivity due to long term storage, fluctuation of environmental temperature upon use and so forth, and variation of processed pattern size, because the resist composition is excellent in stability of sensitivity. Therefore, the method is particularly suitable for precise fine processing.

The photoresist composition of the present invention is unlikely to be affected by the environmental temperature during storage and upon use, and excellent in stability of sensitivity. Therefore, it enables stable and easy formation of fine patterns perpendicular to a substrate by exposure with a far ultraviolet ray having a wavelength of 254–193 nm, high energy ray such as excimer laser ray, X-ray, electron ray or the like, and hence it is suitable for fine processing techniques in large scale production processes of semiconductor devices and so forth.

DESCRIPTION OF THE INVENTION AND EMBODIMENTS

Embodiments of the present invention will be explained hereinafter. However, the present invention is not limited to them.

The inventors of the present invention eagerly studied in order to attain the aforementioned object. As a result, they found that use of the α,β-unsaturated ketone compound as an additive of photoresist compositions provided the most excellent effect on stability of sensitivity after long term storage or variation of environmental temperature, and examined various conditions for the above finding. Thus, they accomplished the present invention.

Hereafter, the most characteristic feature of the present invention, the α,β-unsaturated ketone compound, which is to be added to the photoresist composition, will be explained in detail.

Examples of the α,β-unsaturated ketone compound include those represented by the following general formula (1).

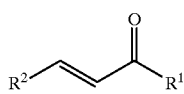

(1)

In the formula, $R^1$ and $R^2$ independently represent a linear alkyl group having 1–10 carbon atoms, a branched alkyl group or cycloalkyl group having 3–10 carbon atoms, or an aryl group having 6–14 carbon atoms.

$R^1$ and $R^2$ represent a linear alkyl group having 1–10 carbon atoms, preferably 1–7 carbon atoms, a branched alkyl group or cycloalkyl group having 3–10 carbon atoms, or an aryl group having 6–14 carbon atoms. Examples thereof include methyl group, ethyl group, n-propyl group, isopropyl group, n-butyl group, isobutyl group, tert-butyl group, n-pentyl group, isopentyl group, hexyl group, heptyl group, nonyl group, decyl group, phenyl group, cyclopentyl group, cyclohexyl group, norbornyl group, adamantyl group and so forth.

Specific examples of the α,β-unsaturated ketone compound represented by the aforementioned general formula (1) include 3-buten-2-one, 4-methyl-3-penten-2-one, 3-methyl-3-buten-2-one, pent-3-en-2-one, 3-octen-2-one, 4-isopropyl-3-buten-2-one, 3-hepten-2-one, 2-hepten-4-one, 3-octen-2-one, 5-isopropyl-2-hepten-4-one, 3-nonen-2-one, 3-nonen-5-one, 3-decen-2-one, 4-phenyl-3-buten-2-one, chalcone, ionone and so forth. Among them, 3-nonen-2-one, 3-octen-2-one and 3-hepten-2-one are particularly preferred.

The photoresist composition to which the aforementioned α,β-unsaturated ketone compound is added may be either of positive type or negative type, and composition of the photoresist composition except for the α,β-unsaturated ketone compound may be a known one.

When a chemical amplification type resist composition which is exposed with a high energy ray having a wavelength of 500 nm or less, X-ray, or electron ray is desired, preferably used is, in particular, a composition comprising a base resin insoluble or difficult to be dissolved in an alkaline solution, which has acidic functional groups protected with acid-labile groups, and becomes alkali-soluble when the acid-labile group are released. The composition further contains an acid-generating agent which generates an acid by irradiation with a far ultraviolet ray, X-ray, electron ray or the like, and usually an organic solvent for dissolving these components, as well as additives such as alkaline or acidic substances, dissolution controlling agents, surface active agents and so forth, if necessary.

The amount of the aforementioned α,β-unsaturated ketone compound is preferably 0.1–10 parts by weight per 100 parts by weight of the whole base resin to be added to the photoresist composition.

When the amount is less than 0.1 part by weight, stability of sensitivity may become insufficient. On the other hand, when the amount exceeds 10 parts by weight, the upper parts of the patterns may have a round shape. Therefore, the amount is preferably within the above range. In particular, when the amount is adjusted to 0.5–6 parts by weight, the aforementioned problems can surely be eliminated.

Examples of the base resin used for the photoresist composition of the present invention include novolak resins, vinylphenol resins, isopropenylphenol resins, copolymers of vinylphenol or isopropenylphenol and styrene, acrylonitrile or (meth)acrylate and so forth.

The aforementioned base resin may be a base resin insoluble or difficult to be dissolved in an alkaline solution, which has acid functional groups protected with known acid-labile groups such as tert-butoxycarbonyl group, tert-butoxycarbonylmethyl group, tetrahydro-2-furyl group, methoxymethyl group and ethoxy ethyl group, and becomes alkali soluble when the acid-labile groups are released.

The acid generating agent is not particularly limited, and known conventional onium salts, organic halogen compounds, orthoquinone diazide compounds, sulfonic acid compounds and so forth can be used.

The organic solvent is not also particularly limited, and examples thereof include ketones such as cyclohexanone and methyl-2-n-amyl ketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether, esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate and so forth. These solvents may each be used alone, or used as a mixture of two or more kinds of them.

The base substance is not also particularly limited, and examples thereof include known conventional substances, for example, ammonia, aliphatic primary amines such as monomethylamine, aliphatic secondary amines such as dimethylamine and diethylamine, aliphatic tertiary amines such as trimethylamine, triethylamine and tributylamine and so forth. These substances may each be used alone, or used as a mixture of two or more kinds of them.

Examples of the dissolution controlling agent include compounds having a molecular weight of 100–1000 and two or more phenolic hydroxyl groups in a molecule, with hydrogen atoms of the phenolic hydroxyl groups being substituted with acid-labile groups at an average ratio of 10–100% as a whole.

The surface active agent is not also particularly limited, and known conventional perfluoroalkylpolyoxyethylene ethanols, fluorinated alkyl esters, perfluoroalkylamine oxides, perfluoroalkyl ethers and so forth can be used.

Specifically, the present invention can be used for any one of the chemical amplification type resist composition disclosed in Japanese Patent Unexamined Publication (Kokai) 9-211866, which contains polyhydroxystyrene protected with two or more sorts of acid-labile groups as a main component; the chemical amplification type resist composition disclosed in Japanese Patent Application No. 9-291681, which contains polyhydroxystyrene protected with two or more sorts of acid-labile groups and acid-labile cross-linking groups as a main component; the chemical amplification type resist composition disclosed in Japanese Patent Unexamined Publication (Kokai) 6-266112, which contains a polyacrylic resin and copolymer of polyhydroxystyrene protected with acid-labile groups as a main component; and the chemical amplification type resist compositions for ArF excimer lasers, which contains a polyacrylic resin or polycycloolefin resin as a main component.

Now, the patterning method utilizing the photoresist composition of the present invention will be explained.

The patterning method comprises, at least, (i) a step of application of the aforementioned photoresist composition of the present invention to a substrate, (ii) a step of, after a heat treatment, exposure with a high energy ray having a wavelength of 500 nm or less, X-ray or electron ray through a photomask, and (iii) a step of development with a developer. In the step (iii), the development may be performed after a heat treatment as required.

When a chemical amplification type resist composition of positive type is used as the resist composition of the present invention, the patterning can be performed by using, for example, a known lithography technique.

Specifically, in the step (i), the photoresist composition is applied to a substrate such as silicone wafers and so forth so as to have a thickness of 0.5–2.0 μm by, for example, spin coating.

In the step (ii), the substrate is pre-baked on a hot plate at 60–150° C. for 1–10 minutes, preferably at 80–120° C. for 1–5 minutes, and after a mask for forming a desired pattern is superimposed on the resist film, the substrate is irradiated with a far ultraviolet ray having a wavelength of 300 nm or less, high energy ray such as excimer laser ray, X-ray, electron ray or the like at an exposure of 1–200 mJ/cm$^2$, preferably at 10–100 mJ/cm$^2$.

Then, in the step (iii), the substrate with the photoresist is subjected to post exposure bake (PEB) on a hot plate at 60–150° C. for 1–5 minutes, preferably at 80–120° C. for 1–3 minutes. Subsequently, the photoresist is subjected to development with a developer consisting of an aqueous alkaline solution containing 0.1–5%, preferably 2–3% of tetramethylammonium hydroxide (TMAH) or the like for 0.1–3 minutes, preferably for 0.5–2 minutes by any of conventional methods such as dip method, paddle method and spray method and so forth to obtain a desired pattern on the substrate.

The resist composition of the present invention is especially suitable for fine patterning using, in particular, a far ultraviolet ray having a wavelength of 254–193 nm, excimer laser ray, X-ray or electron ray among high energy rays.

That is, the resist composition of the present invention containing the α,β-unsaturated ketone compound, in particular, the resist composition comprising an organic solvent, a base resin insoluble or difficult to be dissolved in an alkaline solution, which has acidic functional groups protected with acid-labile groups, and becomes alkali-soluble when the acid-labile group are released, and an acid-generating agent, or such a resist composition further comprising a basic compound and the like in addition to the aforementioned components show excellent stability of sensitivity, and does not show variation of sensitivity even after long term storage or due to fluctuation of environmental temperature and variation of processed pattern size. Therefore, it has excellent practical utility, and it is suitable for precise fine processing.

Even when a negative type resist composition is used, the patterning can also be performed by the steps (i) to (iii) in a conventional manner.

EXAMPLES

The present invention will be explained with reference to the following examples and comparative examples.

Example 1

A mixed solution containing the resist composition A shown in Table 1 and the α,β-unsaturated ketone compounds shown in Table 2 was prepared, and filtered through a Teflon filter having a pore size of 0.2 μm to obtain a resist solution.

TABLE 1

| Resist composition A | Part by weight |
| --- | --- |
| Polyhydroxystyrene having weight average molecular weight of 11,000 with hydroxyl groups partially protected with 14% by mol of 1-ethoxyethyl groups and 13% by mol of tert-butoxycarbonyl groups | 80 |
| Bis(cyclohexylsulfonyl)diazomethane | 5 |
| Tributylamine | 0.125 |
| KH-20 (fluorocarbon surface active agent, produced by Asahi Glass Co., Ltd.) | 0.25 |
| Propylene glycol monomethyl ether acetate | 450 |

TABLE 2

| Substance No. | α, β-Unsaturated ketone compound | Addition amount (wt. %) |
| --- | --- | --- |
| 1 | 3-Nonen-2-one | 1.0 |
| 2 | 3-Nonen-2-one | 5.0 |
| 3 | 4-Isopropyl-3-buten-2-one | 3.0 |
| 4 | 4-Phenyl-3-butenone | 2.0 |

The obtained resist solution was divided into three sealable containers. The first portion of the resist solution was immediately determined for its initial sensitivity according to the method explained below. One of the portions of the resist solution divided into the other containers was stored in a thermostat controlled at 40° C. for 40 days, and the other portion of the resist solution was stored in a thermostat controlled at 23° C. for 120 days. Then, their sensitivity was determined by the same method. The rate of sensitivity change between an initial sensitivity and a sensitivity of resist composition after storage in the thermostat [=(1−Sensitivity after storage/Initial sensitivity)×100 (%)] was used as an index of stability of sensitivity.

[Sensitometry and Evaluation of Sensitivity Stability]

Each of the aforementioned resist solutions was spin-coated on a silicone wafer cleaned in a conventional manner, and baked on a hot plate at 100° C. for 90 seconds to obtain a resist having a thickness of 0.55 μm. The resist was exposed by using an excimer laser stepper (NSR-2005EX8A, NA=0.5, produced by NIKON CORP.) with various exposure amounts, then baked at 110° C. for 90 seconds, and developed with a 2.38% aqueous solution of tetramethylammonium hydroxide for 60 seconds to obtain positive type patterns.

Width of the formed line patterns was measured by a scanning electron microscope, and the exposure affording a width of 0.30 μm was used as sensitivity. The obtained results are shown in Table 7.

Example 2

A mixed solution containing the resist composition B shown in Table 3 and the α,β-unsaturated ketone compounds shown in Table 2 was prepared, and filtered through a Teflon filter having a pore size of 0.2 μm to obtain a resist solution.

The same procedure as in Example 1 was repeated by using the obtained resist solution to determine its sensitivity and stability of sensitivity. The obtained results are shown in Table 7.

TABLE 3

| Resist composition B | Part by weight |
| --- | --- |
| Polyhydroxystyrene having weight average molecular weight of 25,000 with hydroxyl groups partially protected with 20% by mol of 1-ethoxyethyl groups and 5% by mol of tert-butoxycarbonyl groups, and partially cross-linked with 4% by mol of 1,2-propanediol divinyl ether | 80 |
| Triphenylsulfonium tosylate | 2 |
| Salicylic acid | 1 |
| Tributylamine | 0.125 |
| KH-20 (fluorocarbon surface active agent, produced by Asahi Glass Co., Ltd.) | 0.25 |
| Propylene glycol monomethyl ether acetate | 450 |

Example 3

A mixed solution containing the resist composition C shown in Table 4 and the α,β-unsaturated ketone compounds shown in Table 2 was prepared, and filtered through a Teflon filter having a pore size of 0.2 μm to obtain a resist solution.

The same procedure as in Example 1 was repeated by using the obtained resist solution to determine its sensitivity and stability of sensitivity. The obtained results are shown in Table 7.

TABLE 4

| Resist composition C | Part by weight |
| --- | --- |
| Poly[(t-butyl acrylate)/(hydroxystyrene)] (copolymer in molar ratio of 30:70 having weight average molecular weight of 10,000) | 80 |
| Bis(cyclohexylsulfonyl)diazomethane | 5 |
| Salicylic acid | 1 |
| Tributylamine | 0.125 |
| FC-430 (fluorocarbon surface active agent, produced by Sumitomo 3M Co., Ltd.) | 0.25 |
| Propylene glycol monomethyl ether acetate | 450 |

Example 4

A mixed solution containing the resist composition D shown in Table 5 and the α,β-unsaturated ketone compounds shown in Table 2 was prepared, and filtered through a Teflon filter having a pore size of 0.2 μm to obtain a resist solution.

The same procedure as in Example 1 was repeated by using the obtained resist solution to determine its sensitivity and stability of sensitivity. Although this resist composition was a resist for ArF excimer laser, evaluation was performed by using a KrF excimer laser stepper. The obtained results are shown in Table 7.

TABLE 5

| Resist composition D | Part by weight |
| --- | --- |
| Poly[(t-butyl methacrylate)/(methyl methacrylate)/(polymethacrylic acid)] (copolymer in molar ratio of 40:40:20 having weight average molecular weight of 12,000) | 80 |
| Triphenylsulfonium perfluorobutylsulfonate | 2 |
| Tributylamine | 0.125 |
| KH-20 (fluorocarbon surface active agent, produced by Asahi Glass Co., Ltd.) | 0.25 |
| Mixed solvent of propylene glycol monomethyl ether acetate and ethyl lactate (7:3) | 450 |

Example 5

A mixed solution containing the resist composition E shown in Table 6 and the α,β-unsaturated ketone compounds shown in Table 2 was prepared, and filtered through a Teflon filter having a pore size of 0.2 μm to obtain a resist solution.

The same procedure as in Example 4 was repeated by using the obtained resist solution to determine its sensitivity and stability of sensitivity. The obtained results are shown in Table 7.

TABLE 6

| Resist composition E | Part by weight |
| --- | --- |
| Poly[(t-butyl 5-norbornene-2-carboxylic acid)/(maleic anhydride)/(5-norbornene-2,3-dicarboxylic acid anhydride)] (copolymer in molar ratio of 30:50:20 having weight average molecular weight of 9,000) | 80 |
| Triphenylsulfonium perfluorobutylsulfonate | 2 |
| Tributylamine | 0.125 |
| KH-20 (fluorocarbon surface active agent, produced by Asahi Glass Co., Ltd.) | 0.25 |
| Cyclohexanone | 450 |

TABLE 7

| Example | α, β-Unsaturated ketone | Initial sensitivity (mJ/cm$^2$) | Sensitivity after 120 days at 23° C[1] (mJ/cm$^2$) [Changing ratio (%)[3]] | Sensitivity after 40 days at 40° C[2] (mJ/cm$^2$) [Changing ratio (%)[3]] |
| --- | --- | --- | --- | --- |
| 1 | No. 1 | 30.0 | 29.7 [1.0] | 22.4 [25.3] |
|   | No. 2 | 30.5 | 30.3 [0.7] | 23.9 [21.6] |
|   | No 3 | 30.0 | 29.7 | 22.7 |

TABLE 7-continued

| Example | α, β-Unsaturated ketone | Initial sensitivity (mJ/cm$^2$) | Sensitivity after 120 days at 23° C[1] (mJ/cm$^2$) [Changing ratio (%)[3]] | Sensitivity after 40 days at 40° C[2] (mJ/cm$^2$) [Changing ratio (%)[3]] |
|---|---|---|---|---|
|  |  |  | [1.0] | [24.3] |
|  | No. 4 | 31.0 | 30.8 | 23.5 |
|  |  |  | [0.6] | [24.2] |
| 2 | No. 1 | 31.0 | 29.5 | 21.4 |
|  |  |  | [4.8] | [31.0] |
|  | No. 2 | 32.5 | 31.6 | 22.9 |
|  |  |  | [2.8] | [29.5] |
| 3 | No. 3 | 44.0 | 42.9 | 37.8 |
|  |  |  | [2.5] | [14.1] |
|  | No. 4 | 44.0 | 42.7 | 37.0 |
|  |  |  | [3.0] | [15.9] |
| 4 | No. 1 | 52.0 | 50.1 | 45.4 |
|  |  |  | [3.7] | [12.7] |
|  | No. 2 | 53.0 | 51.0 | 47.3 |
|  |  |  | [3.8] | [10.8] |
|  | No. 3 | 53.0 | 52.5 | 44.8 |
|  |  |  | [0.9] | [15.5] |
|  | No. 4 | 53.0 | 52.6 | 46.7 |
|  |  |  | [0.8] | [11.9] |

[1]Sensitivity after storage of 120 days at 23° C.
[2]Sensitivity after storage of 40 days at 40° C.
[3]Changing ratio relative to initial sensitivity Comparative Example 1

A mixed solution containing the resist composition A shown in Table 1 but not containing any α,β-unsaturated ketone compound, and a mixed solution containing the resist composition A shown in Table 1 and phorone as an α,β,α', β'-unsaturated ketone compound were prepared, and filtered through a Teflon filter having a pore size of 0.2 μm to obtain resist solutions.

The same procedure as in Example 1 was repeated by using each of the obtained resist solutions to determine their sensitivity and stability of sensitivity. The obtained results are shown in Table 8.

Comparative Example 2

A mixed solution containing the resist composition B shown in Table 3 but not containing any α,β-unsaturated ketone compound, and a mixed solution containing the resist composition B shown in Table 3 and phorone as an α,β,α', β'-unsaturated ketone compound were prepared, and filtered through a Teflon filter having a pore size of 0.2 μm to obtain resist solutions.

The same procedure as in Example 2 was repeated by using each of the obtained resist solutions to determine their sensitivity and stability of sensitivity. The obtained results are shown in Table 8.

Comparative Example 3

A mixed solution containing the resist composition C shown in Table 4 but not containing any α,β-unsaturated ketone compound, and a mixed solution containing the resist composition C shown in Table 4 and phorone as an α,β,α', β'-unsaturated ketone compound were prepared, and filtered through a Teflon filter having a pore size of 0.2 μm to obtain resist solutions.

The same procedure as in Example 3 was repeated by using each of the obtained resist solutions to determine their sensitivity and stability of sensitivity. The obtained results are shown in Table 8.

Comparative Example 4

A mixed solution containing the resist composition D shown in Table 5 but not containing any α,β-unsaturated ketone compound, and a mixed solution containing the resist composition D shown in Table 5 and phorone as an α,β,α', β'-unsaturated ketone compound were prepared, and filtered through a Teflon filter having a pore size of 0.2 μm to obtain resist solutions.

The same procedure as in Example 4 was repeated by using each of the obtained resist solutions to determine their sensitivity and stability of sensitivity. The obtained results are shown in Table 8.

Comparative Example 5

A mixed solution containing the resist composition E shown in Table 6 but not containing any α,β-unsaturated ketone compound, and a mixed solution containing the resist composition E shown in Table 6 and phorone as an α,β,α', β'-unsaturated ketone compound were prepared, and filtered through a Teflon filter having a pore size of 0.2 μm to obtain resist solutions.

The same procedure as in Example 5 was repeated by using each of the obtained resist solutions to determine their sensitivity and stability of sensitivity. The obtained results are shown in Table 8.

TABLE 8

| Comparative Example | Unsaturated ketone | Initial sensitivity (mJ/cm$^2$) | Sensitivity after 120 days at 23° C[1] (mJ/cm$^2$) [Changing ratio (%)[3]] | Sensitivity after 40 days at 40° C[2] (mJ/cm$^2$) [Changing ratio (%)[3]] |
|---|---|---|---|---|
| 1 | No addition | 29.0 | 27.2 | 12.8 |
|  |  |  | [6.2] | [55.9] |

TABLE 8-continued

| Comparative Example | Unsaturated ketone | Initial sensitivity (mJ/cm²) | Sensitivity after 120 days at 23° C[1] (mJ/cm²) [Changing ratio (%)[3]] | Sensitivity after 40 days at 40° C[2] (mJ/cm²) [Changing ratio (%)[3]] |
|---|---|---|---|---|
|  | Phorone | 30.0 | 28.4 [5.3] | 15.4 [48.7] |
| 2 | No addition | 30.0 | 27.5 [8.3] | 11.6 [61.3] |
|  | Phorone | 31.5 | 29.4 [6.7] | 14.6 [53.7] |
| 3 | No addition | 44.0 | 42.5 [3.4] | 28.5 [35.2] |
|  | Phorone | 44.0 | 42.8 [2.7] | 30.9 [29.8] |
| 4 | No addition | 52.0 | 49.0 [5.8] | 37.7 [27.5] |
|  | Phorone | 53.0 | 50.7 [4.3] | 40.4 [23.8] |
| 5 | No addition | 52.0 | 51.6 [0.8] | 38.0 [26.9] |
|  | Phorone | 53.0 | 52.6 [0.8] | 40.1 [24.3] |

[1] Sensitivity after storage of 120 days at 23° C.
[2] Sensitivity after storage of 40 days at 40° C.
[3] Changing ratio relativeto initial sensitivity From the aforementioned results, it became clear that the resist compositions containing the α,β-unsaturated ketone compounds showed smaller sensitivity fluctuation, in particular, when the compositions were stored at 40° C., compared with the resist compositions not containing the α,β-unsaturated ketone compounds or containing phorone as an α,β,α',β'-unsaturated ketone compound, and thus the sensitivity stability during storage was markedly improved.

As explained above, by addition of the α,β-unsaturated ketone compound, sensitivity fluctuation of resist compositions can be made extremely small, and there can be obtained a resist composition affording a stable pattern size without changing process conditions in lithography.

The present invention is not limited to the embodiments mentioned above. The above-described embodiments are mere examples, and those having the substantially same features as those described in the appended claims and providing the similar functions and advantages are included in the scope of the present invention.

For example, while the present invention was specifically explained for positive type resist compositions, it exhibits the same effect also in negative type resist compositions.

What is claimed is:

1. A chemically amplified positive photoresist composition containing at least an α,β-unsaturated ketone compound represented by the following general formula (1):

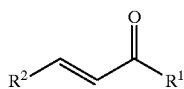

(1)

wherein $R^1$ and $R^2$ independently represent a linear alkyl group having 1–10 carbon atoms, a branched alkyl group or a cycloalkyl group having 3–10 carbon atoms, or an aryl group having 6–14 carbon atoms.

2. The photoresist composition according to claim 1, wherein exposure of the chemically amplified positive photoresist composition is performed with a high energy ray having a wavelength of 500 nm or less, X-ray or electron ray.

3. A chemically amplified photoresist composition containing at least an α,β-unsaturated ketone compound and an acid generating agent, wherein the α,β-unsaturated ketone compound is represented by the following general formula (1):

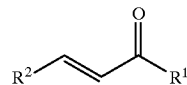

(1)

wherein $R^1$ and $R^2$ independently represent a linear alkyl group having 1–10 carbon atoms, a branched alkyl group or a cycloalkyl group having 3–10 carbon atoms, or an aryl group having 6–14 carbon atoms.

4. A photoresist composition according to claim 3, which is a chemically amplified photoresist composition for which exposure is performed with a high energy rate having a wavelength of 500 nm or less, X-ray or electron ray.

5. A patterning method comprising at least the following steps:
   (i) a step of application of the chemically amplified positive photoresist composition according to claim 1 to a substrate,
   (ii) a step of, after heat treatment, exposure with a high energy ray having a wavelength of 500 nm or less, X-ray or electron ray through a photomask, and
   (iii) a step of development with a developer.

6. A patterning method comprising at least the following steps:
   (i) a step of application of the chemically amplified positive photoresist composition according to claim 2 to a substrate,
   (ii) a step of, after a heat treatment, exposure with a high energy ray having a wavelength of 500 nm or X-ray or electron ray through a photomask, and
   (iii) a step of development with a developer.

7. A patterning method comprising at least the following steps:
   (i) a step of application of a photoresist composition according to claim 3 to a substrate,
   (ii) a step of, after a heat treatment, exposure with a high energy ray having a wavelength of 500 nm or less, X-ray or electron ray through a photomask, and
   (iii) a step of development with a developer.

* * * * *